United States Patent
Soma (10) Patent No.: US 8,347,179 B2
(45) Date of Patent: Jan. 1, 2013

(54) SELECTIVE STORAGE OF ADDITIONAL INVERSION DATA OR EDC DATA

(75) Inventor: Yoshitaka Soma, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 471 days.

(21) Appl. No.: 12/659,685

(22) Filed: Mar. 17, 2010

(65) Prior Publication Data

US 2010/0241927 A1  Sep. 23, 2010

(30) Foreign Application Priority Data

Mar. 18, 2009 (JP) .................................. 2009-066977

(51) Int. Cl.
*G11C 29/00* (2006.01)
(52) U.S. Cl. ........................................ 714/763; 714/760
(58) Field of Classification Search .................. None
See application file for complete search history.

(56) References Cited

U.S. PATENT DOCUMENTS

| | | | | |
|---|---|---|---|---|
| 5,644,583 A | * | 7/1997 | Garcia et al. | 714/764 |
| 8,060,813 B2 | * | 11/2011 | Yoon et al. | 714/807 |
| 2003/0066005 A1 | * | 4/2003 | Iglesia et al. | 714/752 |
| 2009/0187803 A1 | * | 7/2009 | Anholt et al. | 714/752 |
| 2010/0257428 A1 | * | 10/2010 | Murin | 714/752 |
| 2011/0239090 A1 | * | 9/2011 | Iwatsuki | 714/763 |
| 2012/0131418 A1 | * | 5/2012 | Tarui et al. | 714/763 |

FOREIGN PATENT DOCUMENTS

JP  2002-244932  8/2002

* cited by examiner

*Primary Examiner* — Gabriel Chu
(74) *Attorney, Agent, or Firm* — McGinn IP Law Group, PLLC

(57) ABSTRACT

A data processing apparatus includes a non-volatile semiconductor memory configured to store a storage data and an additional data control circuit configured to generate an additional data and add the additional data to a main storage data, and the additional data is different between a first mode and a second mode. The additional data control circuit includes a first mode circuit configured to generate the additional data in the first mode; and a second mode circuit configured to generate the additional data in the second mode. The storage data contains a target data or an inversion data of the target data, as the main storage data and the additional data.

10 Claims, 10 Drawing Sheets

Fig. 1

1: DATA PROCESSING APPARATUS

SELECTIVE STORAGE OF ADDITIONAL INVERSION DATA OR EDC DATA

INCORPORATION BY REFERENCE

This application claims a priority on convention based on Japanese Patent Application No. 2009-066977. The disclosure thereof is incorporated herein by reference.

TECHNICAL FIELD

The present invention relates to a data processing apparatus a data processing method, in which a non-volatile semiconductor memory is used.

BACKGROUND ART

Non-volatile semiconductor memories such as a flash memory and EEPROM (Electrically Erasable and Programmable Read Only Memory) are known. In such a non-volatile semiconductor memory, a cell transistor having a charge storage layer such as a floating gate is used as a memory cell. When electrons are injected into the charge storage layer, a threshold voltage of the cell transistor is increased. On the other hand, when the electrons are pulled out from the charge storage layer, the threshold voltage of the cell transistor is decreased. By using the change in the threshold voltage, the cell transistor stores the data of "0" or "1". A state in which the threshold voltage is relatively low is an "erased state", and this is related to the data of "1". On the other hand, a state in which the threshold voltage is relatively high is a "written state" ("programmed state"), and this is related to the data of "0".

In a typical non-volatile semiconductor memory, data write is executed after data erasure is executed once. As an example, the write of the data of "0001" is considered. In this case, after the data of all the corresponding bits are erased and the bit state becomes "1111", the data of "0001" is again written. At this time, the electron injection (writing process) is performed in each of the three memory cells corresponding to the bits of "0", and the electron injection is not performed on the other memory cells. As a result, the values of the bits corresponding to the three memory cells are changed from "1" to "0".

Here, a case is assumed that the respective bits of the data of "0001" are inverted and the inversion data of "1110" is written. In that case, the number of bits of "0" included in the inversion data is "1". Thus, it is adequate to perform the electron injection into only the memory cell corresponding to the one bit. That is, since the inversion data of "1110" is written instead of the data of "0001", a power consumption amount (a current consumption amount) required to write the data can be reduced.

As described above, when the write data includes many bits of "0", the power consumption amount can be reduced by writing its inversion data. Whether the write data is written in its original state or the inverted state is indicated by an "inversion flag". The inversion flag is related to the write data or inversion data and written with the data in the memory. When the data is read, the original data can be recovered from a read data, by referring to this inversion flag. Such a technique is described in the Japanese Patent Publication (JP 2002-244932A: conventional example 1).

The properties necessary for a device that uses the non-volatile semiconductor memory are different depending on a product in which the device is mounted. A product operated with a battery such as a portable telephone requires an operation in a small power consumption amount. Also, a product whose safety is considered to be most important such as an automobile requires extremely high data reliability. However, the development of a different device for each applied product is not preferable from the viewpoint of a cost.

SUMMARY OF THE INVENTION

In an aspect of the present invention, a data processing apparatus includes a non-volatile semiconductor memory in which a storage data including a target data or an inversion data of the target data, as a main storage data and an additional data is stored; and an additional data control circuit configured to generate the additional data and add the additional data to the main storage data, wherein the additional data is different between a first mode and a second mode. The additional data control circuit includes a first mode circuit configured to generate the additional data in the first mode; and a second mode circuit configured to generate the additional data in the second mode. The first mode circuit includes a data inversion control circuit configured to receive the target data, determine whether each of bits of the target data should be inverted, generate the additional data including an inversion flag indicating the determining result, and generate the storage data by adding the additional data including the inversion flag to the main storage data. The second mode circuit includes an error detection control circuit configured to generate the additional data including an error detection code used for error detection to the target data, and generate the storage data by adding the additional data including the error detection code to the main storage data.

In another aspect of the present invention, data processing method is achieved by setting a first mode or a second mode in response to a mode specifying signal; by receiving a target data upon data write; by generating an additional data based on the target data, in which the additional data is different between a first mode and a second mode; and by adding the additional data to a main storage data to generate a storage data. The storage data is stored in a non-volatile semiconductor memory and comprises the main storage data and the additional data, and the main storage data is the target data or an inversion data of the target data. The generating and the adding are executed by a data inversion control circuit of a first mode circuit in the first mode. The generating is achieved by determining whether each of bits of the target data should be inverted, in the first mode; and by generating the additional data including an inversion flag indicating the determining result. The adding is achieved by adding the additional data including the inversion flag to the main storage data in the first mode to generate the storage data. The generating and the adding are executed by an error detection control circuit of a second mode circuit in the second mode. The generating is achieved by generating the additional data including an error detection code used for error detection to the target data in the second mode. The adding is achieved by adding the additional data including the error detection code to the main storage data in the second mode to generate the storage data.

According to the present invention, the function of the data processing apparatus can be switched by using a mode specifying signal. In the first mode, the data inversion control circuit is activated, which can reduce a power consumption amount when the target data is written. In this case, at least a part of the additional data is used as the inversion flag. On the other hand, in the second mode, the error detection control circuit is activated, thereby improving data reliability. In this case, at least a part of the additional data is used as the error detection code. In this way, since the additional data is changed between the first mode and the second mode, the data processing apparatus of one kind can attain both of the small power consumption amount and the high data reliability. The development of the different device for each applied product is not required, which reduces the cost.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Hereinafter, a data processing apparatus of the present invention will be described in detail with reference to the attached drawings.

1. Data Processing Apparatus

Figure 1:
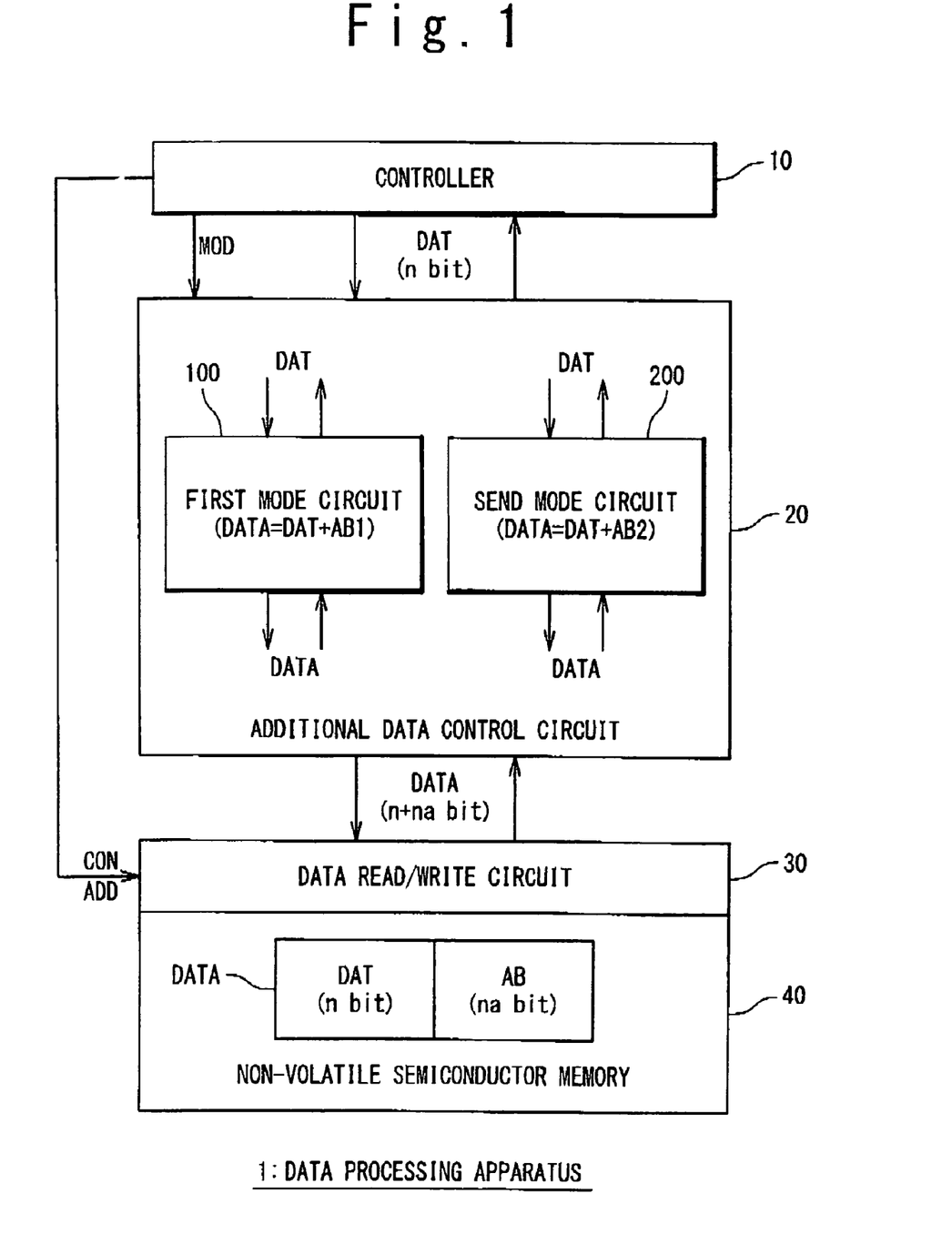
FIG. 1 is a block diagram showing a configuration of a data processing apparatus according to an embodiment of the present invention.

FIG. 1 is schematically showing the configuration of a data processing apparatus 1 according to a first embodiment of the present invention. The data processing apparatus 1 contains a controller 10, an additional data control circuit 20, a data read/write circuit 30 and a non-volatile semiconductor memory 40.

The non-volatile semiconductor memory 40 contains a plurality of memory cells that are arranged in a matrix. As the memory cell, a cell transistor is used which has a charge storage layer such as a floating gate. When electrons are injected into the charge storage layer, a threshold voltage of the cell transistor is increased. On the other hand, when the electrons are pulled out from the charge storage layer, the threshold voltage of the cell transistor is decreased. The cell transistor stores the data of "0" or "1" based on the change in the threshold voltage. A state in which the threshold voltage is relatively low is an "erased state", and this is related to the data of "1", for example. On the other hand, a state in which the threshold voltage is relatively high is a "written state (programmed state)", and this is related to the data of "0", for example.

In this embodiment, an additional control data (hereinafter, to be referred to as an "additional control data AB") is assigned to a data DAT stored in the non-volatile semiconductor memory 40. In short, a storage data DATA stored in the non-volatile semiconductor memory 40 includes a data body DAT and the additional control data AB. Also, as described later, there is a case that the storage data DATA includes an inversion data of the data body DAT and the additional control data AB. The data body DAT is n-bit data, and the additional control data AB is a na-bit data, and thus, the storage data DATA is (n+na)-bit data. The data body DAT and the additional control data AB are related to each other. When the data body DAT (or the inversion data thereof) is written, the corresponding additional control data AB is also written. When the data body DAT (or the inversion data thereof) is read, the corresponding additional control data AB is also read. It should be noted that a data storage region of the non-volatile semiconductor memory 40 may be divided into a region in which the data body DAT (or the inversion data thereof) is stored and a region in which the additional control data AB is stored.

The controller 10 is a circuit for controlling the operation of the data processing apparatus 1 and may include CPU (Central Processing Unit) and a memory controller. The additional data control circuit 20 is a circuit for controlling the additional control data AB, and its detail will be described later. The data read/write circuit 30 is a circuit for reading/writing a data from/into the non-volatile semiconductor memory 40 and includes a decoder, a driver, a sense amplifier and the like.

When the data is written to the non-volatile semiconductor memory 40, the controller 10 outputs the data body DAT to the additional data control circuit 20. Also, the controller 10 outputs a control signal CON for instructing a data write and an address signal ADD for indicating a write destination, to the data read/write circuit 30. The additional data control circuit 20 generates a proper additional control data AB that will be described later, in accordance with the data body DAT received from the controller 10. Then, the additional data control circuit 20 generates the storage data DATA including the additional control data AB and outputs the storage data DATA to the data read/write circuit 30. The data read/write circuit 30 writes the storage data DATA into the write destination specified by the address signal ADD in response to the control signal CON.

When the data is read from the non-volatile semiconductor memory 40, the controller 10 outputs the control signal CON for indicating a data read and the address signal ADD for indicating a read source to the data read/write circuit 30. The data read/write circuit 30 reads the storage data DATA from the read source specified by the address signal ADD in response to the control signal CON. Then, the data read/write circuit 30 outputs the read storage data DATA to the additional data control circuit 20. The additional data control circuit 20 executes a proper process in accordance with the additional control data AB included in the read storage data DATA and generates the original data body 20. Then, the additional data control circuit 20 outputs the obtained data body 20 to the controller 10.

2. Mode Switching

As mentioned above, the storage data DATA stored in the non-volatile semiconductor memory 40 includes the additional control data AB. Thus, various functions can be attained by changing a use method of the additional control data AB.

According to this embodiment, the use method of the additional control data AB can be switched between modes. That is, the data processing-apparatus 1 supports a plurality of modes, and the use method of the additional control data AB is changed between the modes. The mode of the data processing apparatus 1 is specified by a mode specifying signal MOD. By using the mode specifying signal MOD, it is possible to change the use method of the additional control data AB and to switch the function of the data processing apparatus 1.

The plurality of modes of the data processing apparatus 1 includes at least a first mode and a second mode. The controller 10 outputs the mode specifying signal MOD, which specifies the first mode or second mode, to the additional data control circuit 20. The additional data control circuit 20 changes the content of the additional control data AB between the first mode and the second mode in response to the mode specifying signal MOD.

In detail, as shown in FIG. 1, the additional data control circuit 20 includes a first mode circuit 100 and a second mode circuit 200. The first mode circuit 100 is operated when the mode specifying signal MOD specifies the first mode, and generates a first additional control data AB1 for the first mode. On the other hand, the second mode circuit 200 is operated when the mode specifying signal MOD specifies the second mode, and generates a second additional control data AB2 for the second mode. In this way, the additional control data AB is switched to the first additional control data AB1 or the second additional control data AB2 in response to the mode specifying signal MOD.

Figure 2A:
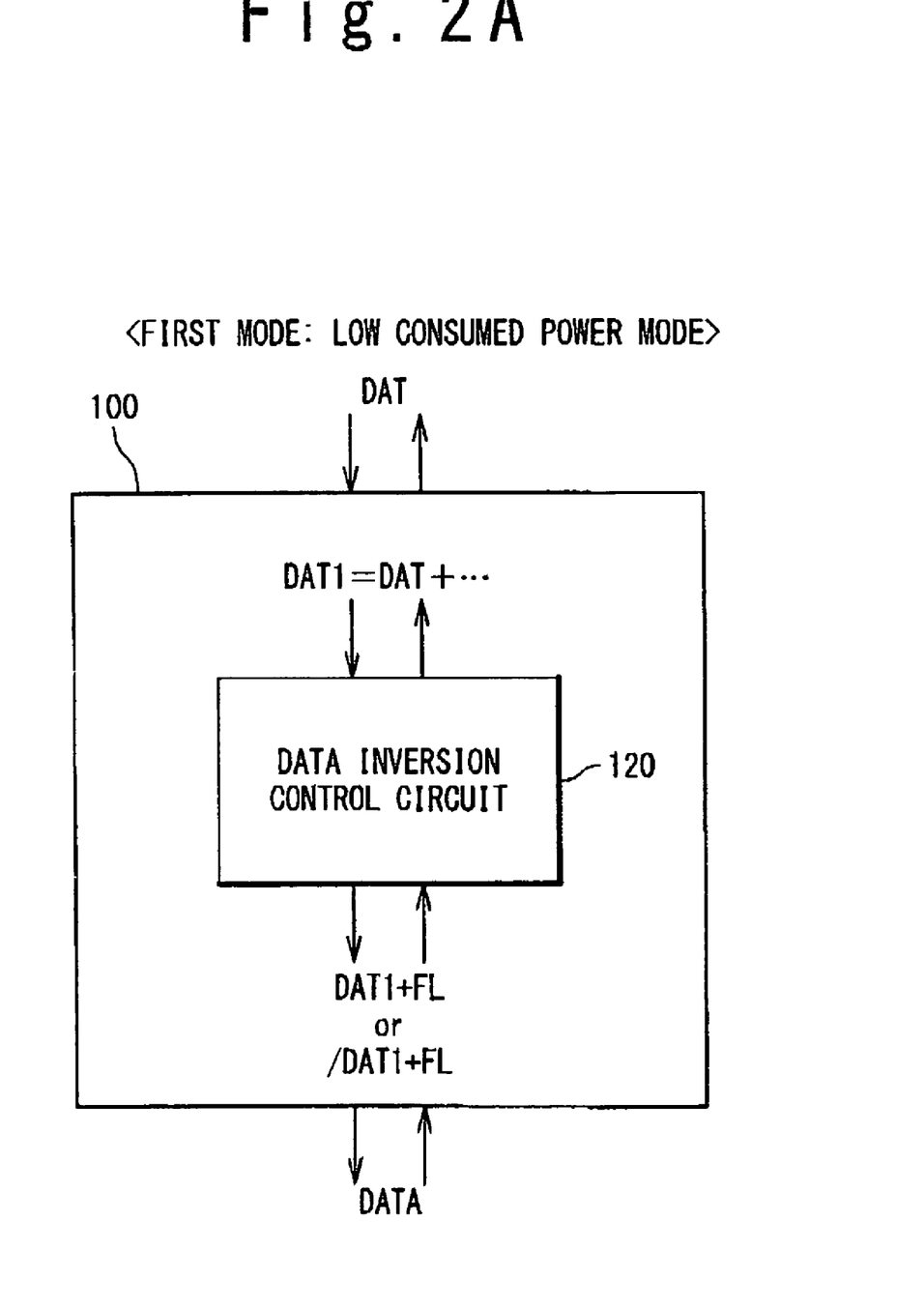
FIGS. 2A and 2B are block diagrams showing configurations of an additional data control circuit according to the embodiment of the present invention.
Figure 2B:
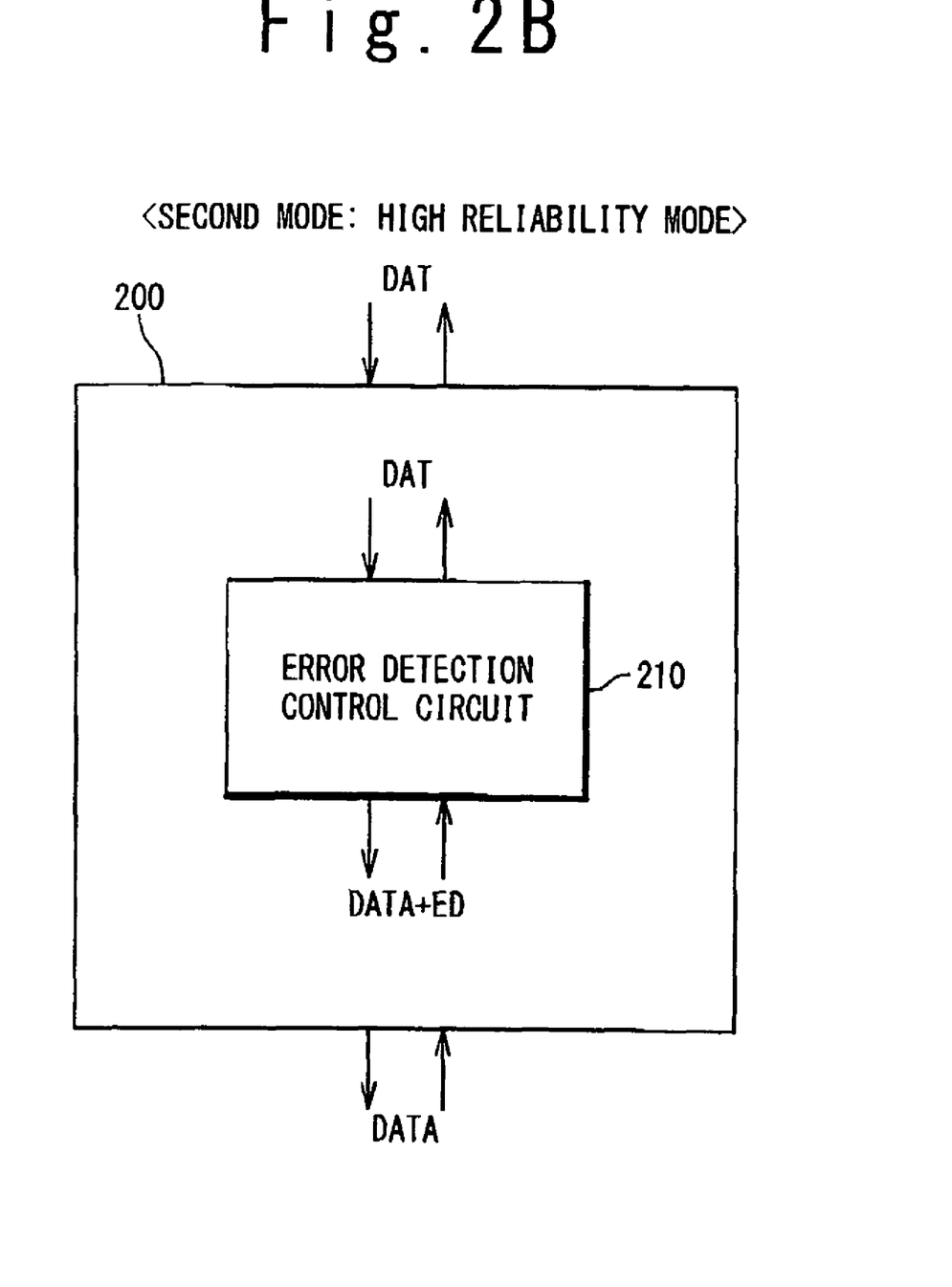

FIGS. 2A and 2B show the configurations of the additional data control circuit 20 according to this embodiment further in detail. In this embodiment, the first mode is a "small power consumption mode", and the second mode is a "high reliability mode". Thus, the first mode circuit 100 for the first mode includes at least the configuration that can attain the small power consumption amount. On the other hand, the second mode circuit 200 for the second mode includes at least the configuration that can attain the high reliability. The first mode and the second mode will be described in detail with reference to FIGS. 2A and 2B.

(First Mode)

In the non-volatile semiconductor memory 40, the data write is executed after the data erasure is executed once. When the many bits of "0" are included in the write data upon the data write, the power consumption amount can be reduced by writing its inversion data. As an example, the write of the data of "0001" is assumed. In this case, the electron injection (writing process) is performed on each of the three memory cells corresponding to the bits of "0", and the electron injection is not executed on the other memory cells. As a result, the values of the bits corresponding to the three memory cells are changed from "1 (erased state)" to "0 (written state)". Next, it is assumed that the respective bits of the data of "0001" are inverted and the inversion data of "1110" is written. In this case, the number of the bits of "0" included in the inversion data is "1". Thus, the electron injection is sufficient to be performed on the memory cell corresponding to the one bit. That is, instead of the data of "0001", the inversion data of "1110" is written, which can reduce a power consumption amount (consumed current), required to write the data.

According to this embodiment, the data inversion control is carried out in the first mode. For this reason, the first mode circuit 100 includes a data inversion control circuit 120 at least. The data inversion control circuit 120 determines whether or not the data is to be inverted, when the data is written, and generates an "inversion flag FL" to indicate the determination result (ordinary or inversion). In the first mode, at least a part of the additional control data AB is assigned to this inversion flag FL. That is, the inversion flag FL belongs to at least a part of the first additional control data AB1.

In detail, when the data is written, the data inversion control circuit 120 receives a "target data DAT1" of the data inversion. The target data DAT1 includes at least the data body DAT. Here, the target data DAT1 is the data of X bits ($X \geq n$).

Next, the data inversion control circuit 120 determines whether or not the respective bits of the target data DAT1 are to be inverted when the data is written. Specifically, the data inversion control circuit 120 checks the number of the bits of "0" included in the target data DAT1. If the number of the bits of "0" is equal to or more than $X/2$, the data inversion control circuit 120 determines that the respective bits of the target data DAT1 are to be inverted. On the other hand, if the number of the bits of "0" is less than $X/2$, the data inversion control circuit 120 determines that the respective bits of the target data DAT1 are not to be inverted.

Next, the data inversion control circuit 120 generates the inversion flag FL to indicate the result of the above determination. The inversion flag FL is set to, for example, "1" in a case of the inversion, and set to "0" in a case of the non-inversion. It should be noted that the inversion flag FL is not limited to the 1-bit data, and this may be a multiple-bit data. For example, the inversion flag FL may be a 3-bit data. In that case, the inversion flag FL is set to "111" in the case of the inversion, and set to "000" in the case of the non-inversion. Typically, the inversion flag FL serves as a Y-bit data (Y is a natural number).

As mentioned above, the data inversion control circuit 120 generates the inversion flag FL as at least apart of the first additional control data AB1, when the data is written in the first mode. In the case of the non-inversion, the data inversion control circuit 120 generates the storage data DATA by adding the inversion flag FL to the storage data DATA itself. On the other hand, in the case of the inversion, the data inversion control circuit 120 and generates an inversion data /DAT1 by inverting the respective bits of the target data DAT1 and adds the inversion flag FL to the inversion data /DAT1 and consequently generates the storage data DATA. The power consumption amount can be reduced by writing the storage data DATA obtained thus into the non-volatile semiconductor memory 40.

When the data is read in the first mode, the data inversion control circuit 120 receives the storage data DATA read from the non-volatile semiconductor memory 40. Then, by referring to the inversion flag FL included in the storage data DATA, the data inversion control circuit 120 recovers the original target data DAT1 from the storage data DATA. Specifically, when the inversion flag FL indicates the non-inversion, the data inversion control circuit 120 outputs the target data DAT1 included in the read storage data DATA, as it is. On the other hand, when the inversion flag FL indicates the inversion, the data inversion control circuit 120 inverts the respective bits of the inversion data /DAT1 included in the read storage data DATA again to generate the target data DAT1 and then outputs the obtained target data DAT1.

It should be noted that when the inversion flag FL of Y bits is read, it is possible to apply a majority operation. To do so, the Y is required to be an odd number of 3 or more. In this case, the data inversion control circuit 120 can correct the error of the read inversion flag FL by using majority logic. Consequently, it is possible to reduce the power consumption amount and also improve the reliability of the inversion flag FL. From this view point, the Y is preferred to be the odd number of 3 or more.

(Second Mode)

The second mode is a mode for detecting a data error and improving data reliability. For this purpose, the second mode circuit 200 includes an error detection control circuit 210 at least. The error detection control circuit 210 generates an "error detection code ED" used to detect an error in the data body DAT, based on the data body DAT. In the second mode, at least a part of the additional control data AB is assigned to this error detection code ED. That is, the error detection code ED belongs to at least a part of the second additional control data AB2.

As the error detection control circuit 210, there is an ECC (Error Checking and Correcting) circuit. The ECC circuit can not only detect an error but also specify a portion (bit) at which the error is generated in the data, and correct it to a correct value. Specifically, when the data is written, the ECC circuit calculates a data referred to as an "Error Correction Code (ECC)" for the data. In the case of the ECC circuit, this error correction code is equivalent to the error detection code ED. The calculated error correction code is stored in a memory space. After that, when the data is read, the ECC circuit detects and corrects any error of the read data by referring to the previously-calculated error correction code.

When the data is written in the second mode, the error detection control circuit 210 generates the error detection code ED as at least a part of the second additional control data AB2. Then, the error detection control circuit 210 generates the storage data DATA by adding the error detection code ED to the data body DAT. The storage data DATA obtained thus is written to the non-volatile semiconductor memory 40.

When the data is read in the second mode, the error detection control circuit 210 receives the storage data DATA read from the non-volatile semiconductor memory 40. Then, in accordance with the error detection code ED included in the storage data DATA, the error detection control circuit 210 detects any error of the data body DAT included in the storage data DATA. Consequently, the data reliability is improved.

As mentioned above, the data processing apparatus 1 according to this embodiment contains the data inversion control circuit 120 and the error detection control circuit 210 and uses the mode specifying signal MOD and can consequently switch the function of the data processing apparatus 1. Specifically, in the first mode, the data inversion control circuit 120 is activated, which can reduce the power consumption amount when the data is written. In this case, at least a part of the additional control data AB is used as the inversion flag FL. On the other hand, in the second mode, the error detection control circuit 210 is activated, thereby improving the data reliability. In this case, at least a part of the additional control data AB is used as the error detection code ED. In this way, by changing the content of the additional control data AB between the first mode and the second mode, the data processing apparatus 1 of one kind can attain both of the small power consumption amount and the high data reliability. The development of a device different for each applied product is not required, thereby reducing the cost.

In this embodiment, the additional control data AB can be said to be effectively used on the basis of a request of a user. The product operated with the battery such as a portable telephone requires the small power consumption operation. Thus, in this case, the data processing apparatus 1 is set to the first mode, and the additional control data AB is assigned to the inversion flag FL. Also, the product whose safety is considered to be most important, such as a car requires the extremely high data reliability. Thus, in this case, the data processing apparatus 1 is set to the second mode, and the additional control data AB is assigned to the error detection code ED.

It should be noted that the mode of the data processing apparatus 1 may be fixed to any one of the two modes or may be properly switched between them. In the latter case, the data storage region of the non-volatile semiconductor memory 40 is preferred to be switched for each mode.

Figure 3:
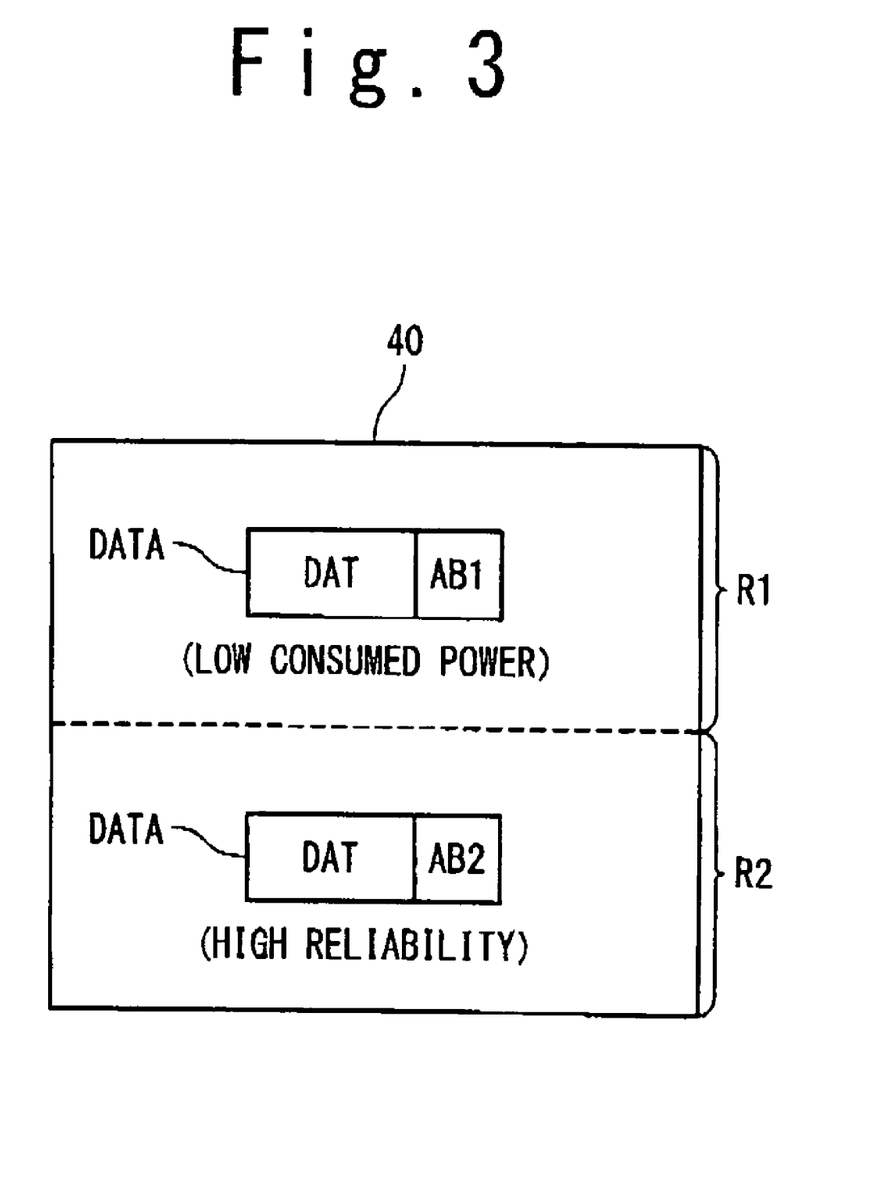
FIG. 3 is a conceptual view showing one example of a method of using a non-volatile semiconductor memory according to the embodiment of the present invention.

FIG. 3 shows an example in which the data storage region of the non-volatile semiconductor memory 40 is switched for each mode. As shown in FIG. 3, the data storage region is divided into a first data region R1 and a second data region R2. At the time of the access to (the data write to/read from) the first data region R1, the mode specifying signal MOD is set to specify the first mode. In short, the first data region R1 is set to the small power consumption region R1. On the other hand, at the time of the access to (the data write to/read from) the second data region R2, the mode specifying signal MOD is set to specify the second mode. In short, the second data region R2 is set to a high reliability region R2.

The foregoing setting can be easily attained by relating the address signal ADD (refer to FIG. 1) for specifying an access destination and the mode specifying signal MOD for specifying the mode to each other. For example, the first data region R1 is a user region, and the data rewrite is frequently executed therein. Since the first data region R1 is assigned to the first mode, the power consumption amount can be reduced when the data is frequently re-written. On the other hand, the second data region R2 is a region in which a program and a trimming code are stored, and the data rewrite is not executed therein, or the number of times of the rewrite is extremely small. Since the second data region R2 is assigned to the second mode, the reliabilities of the program and the trimming code are improved. In this way, since the data storage region is switched for each mode, the non-volatile semiconductor memory 40 can be effectively used.

3. Additional Data Control Circuit 20

Various examples of the additional data control circuit 20 according to this embodiment will be described below. In the following examples, the data body DAT is assumed to a 32-bit data (n=32).

3-1. First Example

Figure 4:
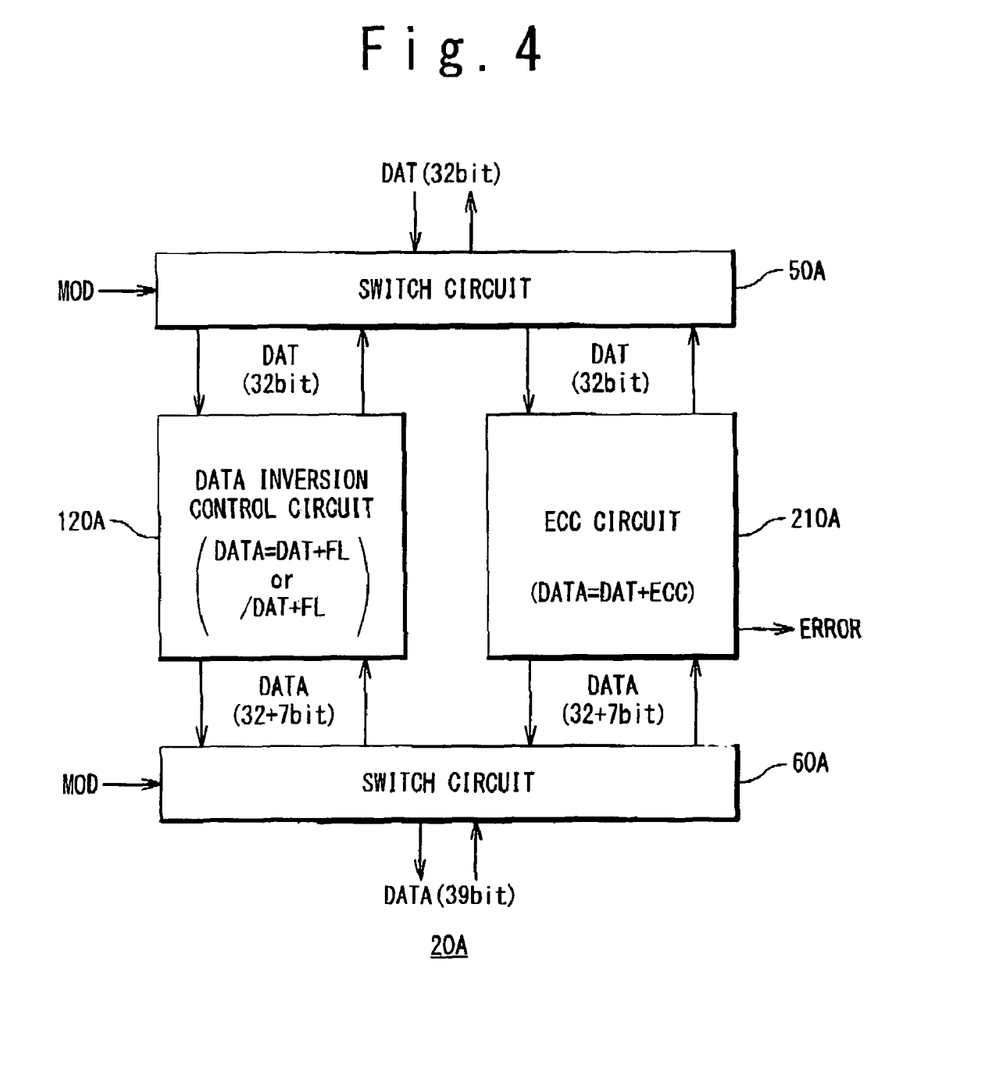
FIG. 4 is a block diagram showing a first example of the additional data control circuit.

FIG. 4 shows a first example. In this example, an additional data control circuit 20A contains switching circuits 50A and 60A, a data inversion control circuit 120A and an ECC circuit 210A. The switching circuits 50A and 60A carry out the switching in response to the mode specifying signal MOD. The data inversion control circuit 120A is included in the first mode circuit 100. The ECC circuit 210A is equivalent to the error detection control circuit 210 in FIG. 2B, and this is included in the second mode circuit 200. In this example, the additional control data AB has 7-bit data (na=7).

(First Mode)

The mode specifying signal MOD for specifying the first mode is supplied to the additional data control circuit 20A. When the mode specifying signal MOD specifies the first mode, the ECC circuit 210A may be made inactive.

When the data is written, the switching, circuit 50A outputs the data body DAT received from the controller 10 to the data inversion control circuit 120A. In this example, the data body DAT is the target data DAT1 for the data inversion. When the number of the bits of "0" included in the data body DAT (32 bits) is equal to or more than 16, the data inversion control circuit 120A determines that the data body DAT is to be inverted. In this case, the inversion flag FL is set to "1111111" indicating the inversion. On the other hand, when the number of the bits of "0" included in the data body DAT (32 bits) is less than 16, the data inversion control circuit 120A determines that the data body DAT is not inverted. In this case, the inversion flag FL is set to "0000000" indicating the non-inversion. The data inversion control circuit 120A generates the storage data DATA of 39 bits by adding the inversion flag FL to the data body DAT or the inversion data /DAT thereof.

Then, the data inversion control circuit 120A outputs the storage data DATA to the switching circuit 60A. The switching circuit 60A outputs the storage data DATA outputted from the data inversion control circuit 120A to the data read/write circuit 30.

When the data is read, the switching circuit 60A outputs the storage data DATA read from the non-volatile semiconductor memory 40 to the data inversion control circuit 120A. The data inversion control circuit 120A refers to the inversion flag FL included in the storage data DATA. Here, the data inversion control circuit 120A may correct the error of the read inversion flag FL (7 bits) by using the majority logic. When the inversion flag FL indicates the non-inversion, the data inversion control circuit 120A outputs the data body DAT to the switching circuit 50A as it is. On the other hand, when the inversion flag FL indicates the inversion, the data inversion control circuit 120A inverts the respective bits of the inversion data /DAT included in the storage data DATA again, and recovers the data body DAT and then outputs the obtained data body DAT to the switching circuit 50A. The switching circuit 50A sends the data body DAT outputted from the data inversion control circuit 120A to the controller 10.

(Second Mode)

The mode specifying signal MOD for specifying the second mode is supplied to the additional data control circuit 20A. When the mode specifying signal MOD specifies the second mode, the data inversion control circuit 120A may be made inactive.

When the data is written, the switching circuit 50A outputs the data body DAT received from the controller 10 to the ECC circuit 210A. The ECC circuit 210A is a 7-bit ECC circuit and calculates a 7-bit error correction code ECC with regard to the received data body DAT. When the data body DAT is a 32-bit data, 2-bit error detection and 1-bit error correction can be made possible through use of the 7-bit error correction code. Thus, sufficient reliability is obtained. The ECC circuit 210A generates a 39-bit storage data DATA by adding the error correction code ECC to the data body DAT. Then, the ECC circuit 210A outputs the storage data DATA to the switching circuit 60A. The switching circuit 60A outputs the storage data DATA outputted from the ECC circuit 210A to the data read/write circuit 30.

When the data is read, the switching circuit 60A outputs the storage data DATA read from the non-volatile semiconductor memory 40 to the ECC circuit 210A. The ECC circuit 210A detects any error with regard to the data body DAT included in the storage data DATA, based on the error correction code ECC included in the storage data DATA. If there is no error, the ECC circuit 210A outputs the read data body DAT as it is to the switching circuit 50A. If the 1-bit error is detected, the ECC circuit 210A corrects the error and outputs the corrected data body DAT to the switching circuit 50A. If the 2-bit error is detected, the ECC circuit 210A sends an error signal ERROR to the controller 10. The switching circuit 50A sends the data body DAT outputted from the ECC circuit 210A to the controller 10.

3-2. Second Example

Figure 5:
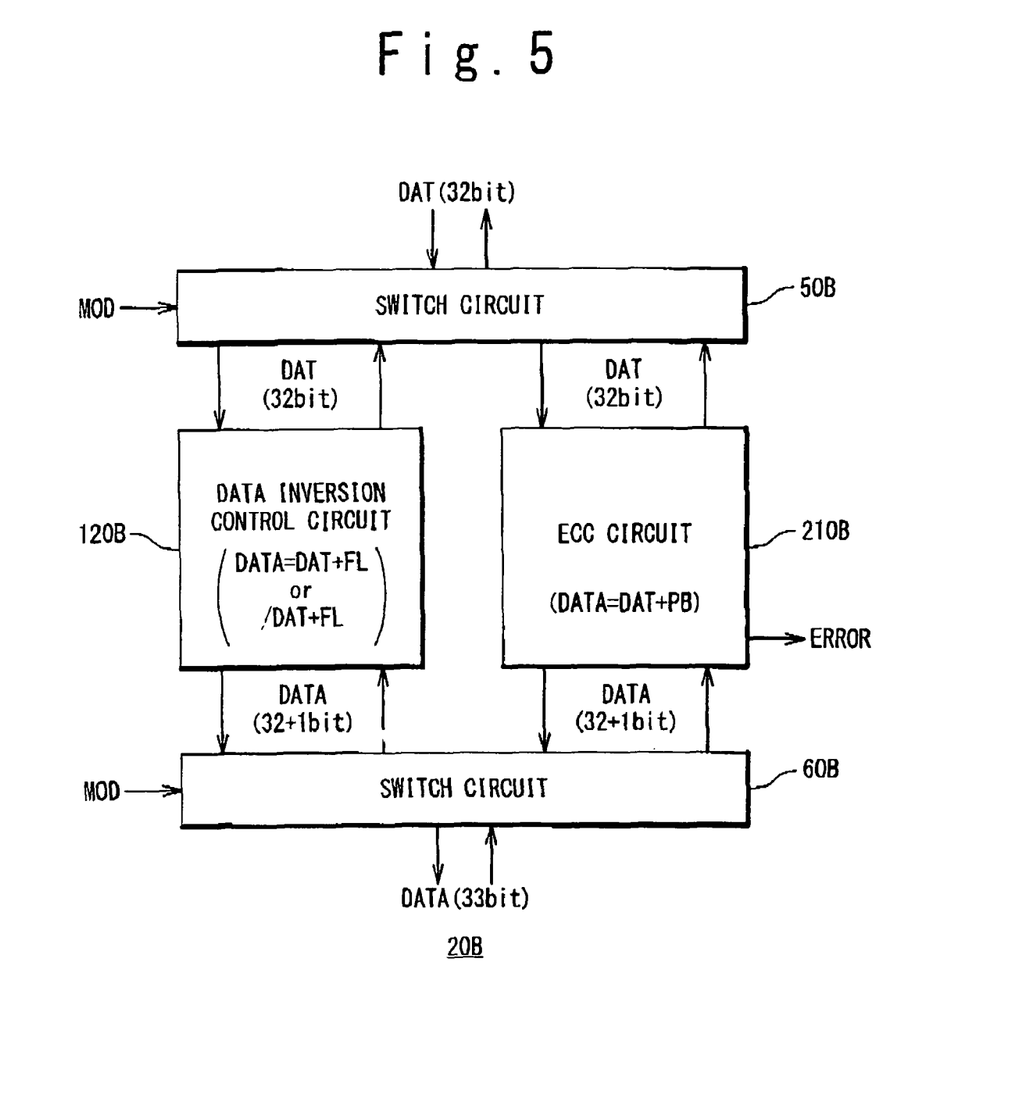
FIG. 5 is a block diagram showing a second example of the additional data control circuit.

FIG. 5 shows a second example. In this example, an additional data control circuit 20B contains switching circuits 50B and 60B, a data inversion control circuit 120B and a parity circuit 210B. The switching circuits 50B and 60B carry out the switching in response to the mode specifying signal MOD. The data inversion control circuit 120B is included in the first mode circuit 100. The parity circuit 210B is equivalent to the error detection control circuit 210 in FIG. 2B, and this is included in the second mode circuit 200. In this example, the additional control data AB has one bit (na=1).

(First Mode).

The mode specifying signal MOD for specifying the first mode is supplied to the additional data control circuit 20B. When the mode specifying signal MOD specifies the first mode, the parity circuit 210B may be made inactive.

When the data is written, the switching circuit 50B outputs the data body DAT received from the controller 10 to the data inversion control circuit 120B. In this example, the data body DAT is the target data DAT1 for the data inversion. When the number of the bits of "0" included in the data body DAT (32 bits) is "16" or more, the data inversion control circuit 120B determines that the data body DAT is to be inverted. In this case, the inversion flag FL is set to "1111111" indicating the inversion. On the other hand, when the number of the bits of "0" included in the data body DAT (32 bits) is less than "16", the data inversion control circuit 120B determines that the data body DAT is not to be inverted. In this case, the inversion flag FL is set to "0" indicating the non-inversion. The data inversion control circuit 120B generates the storage data DATA of 33 bits by adding the inversion flag FL to the data body DAT or the inversion data /DAT thereof. Then, the data inversion control circuit 120B outputs the storage data DATA to the switching circuit 60B. The switching circuit 60B outputs the storage data DATA outputted from the data inversion control circuit 120B to the data read/write circuit 30.

When the data is read, the switching circuit 60B outputs the storage data DATA read from the non-volatile semiconductor memory 40 to the data inversion control circuit 120B. The data inversion control circuit 120B refers to the inversion flag FL included in the storage data DATA. When the inversion flag FL indicates the non-inversion, the data inversion control circuit 120B outputs the data body DAT included in the storage data DATA to the switching circuit 50B as it is. On the other hand, when the inversion flag FL indicates the inversion, the data inversion control circuit 120B inverts the respective bits of the inversion data /DAT included in the storage data DATA again, and recovers the data body DAT and then outputs the obtained data body DAT to the switching circuit 50B. The switching circuit 50B sends the data body DAT outputted from the data inversion control circuit 120B to the controller 10.

(Second Mode)

The mode specifying signal MOD for specifying the second mode is supplied to the additional data control circuit 20B. When the mode specifying signal MOD specifies the second mode, the data inversion control circuit 120B may be made inactive.

When the data is written, the switching circuit 50B outputs the data body DAT received from the controller 10 to the parity circuit 210B. The parity circuit 210B calculates and determines a parity bit PB with regard to the received data body DAT. In this example, this parity bit PB is used as an error correction code ED. The parity circuit 210B generates the 33-bit storage data DATA by adding the parity bit PB to the data body DAT. Then, the parity circuit 210B outputs the storage data DATA to the switching circuit 60B. The switching circuit 60B outputs the storage data DATA outputted from the parity circuit 210B to the data read/write circuit 30.

When the data is read, the switching circuit 60B outputs the storage data DATA read from the non-volatile semiconductor memory 40 to the parity circuit 210B. The parity circuit 210B detects any error with regard to the data body DAT included in the storage data DATA in accordance with the parity bit PB included in the storage data DATA. If there is no error, the parity circuit 210B outputs the read data body DAT to the switching circuit 50B as it is. If the error is detected, the parity circuit 210B sends an error signal ERROR to the controller 10. The switching circuit 50B sends the data body DAT outputted from the parity circuit 210B to the controller 10.

3-3. Third Example

Figure 6:
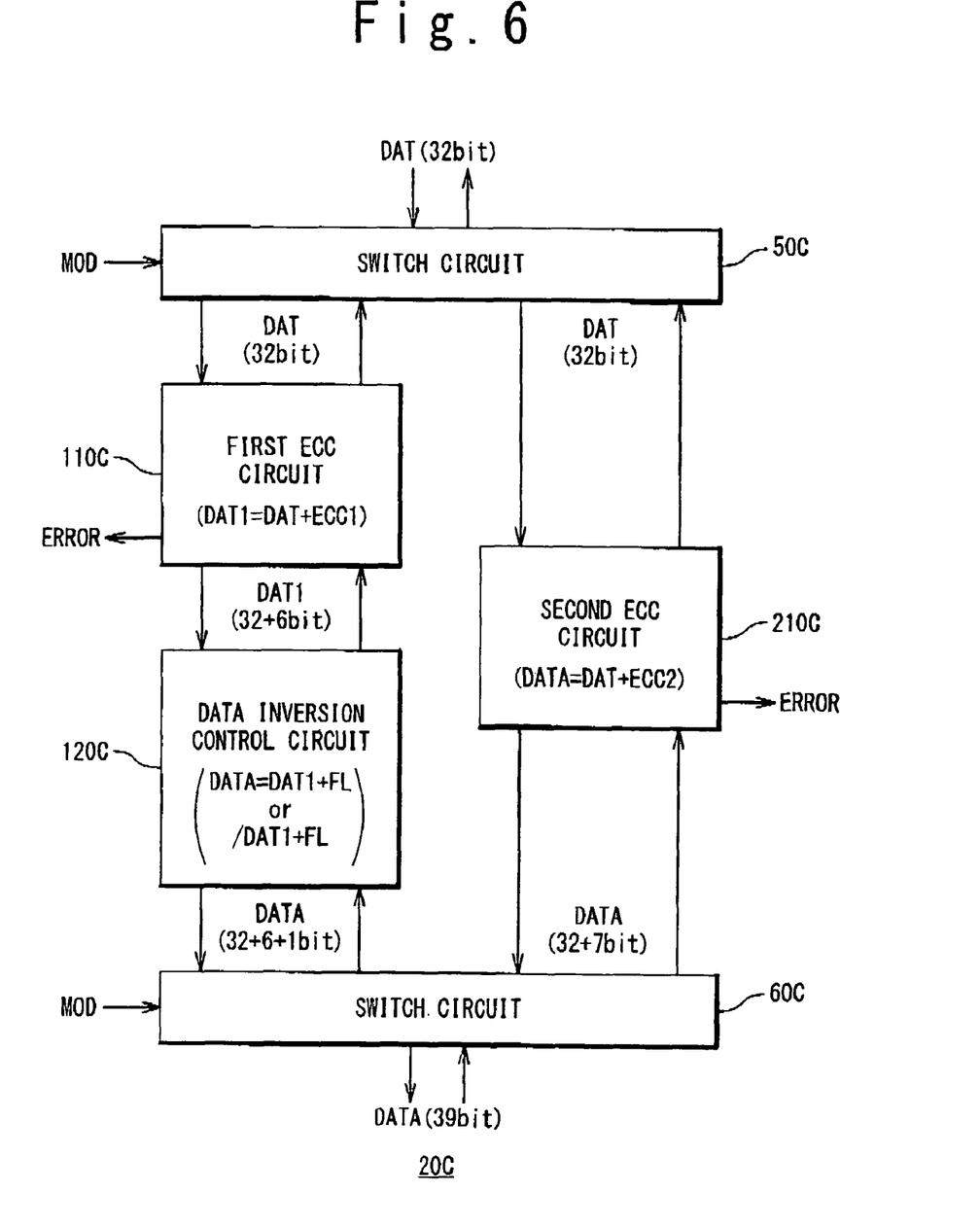
FIG. 6 is a block diagram showing a third example of the additional data control circuit.

FIG. 6 shows a third example. In this example, an additional data control circuit 20C contains switching circuits 50C and 60C, a first ECC circuit 110C, a data inversion control circuit 120C and a second ECC circuit 210C. The switching circuits 50C and 60C carry out the switching in response to the mode specifying signal MOD. The first ECC circuit 110C and the data inversion control circuit 120C are included in the first mode circuit 100. The second ECC circuit 210C is equivalent to the error detection control circuit 210 in FIG. 2B, and this is included in the second mode circuit 200. In this example, the additional control data AB has seven bits (na=7).
(First Mode)

The mode specifying signal MOD for specifying the first mode is supplied to the additional data control circuit 20C. When the mode specifying signal MOD specifies the first mode, the second ECC circuit 210C may be made inactive.

When the data is written, the switching circuit 50C outputs the data body DAT received from the controller 10 to the first ECC circuit 110C. The first ECC circuit 110C is the 6-bit ECC circuit and calculates a first error correction code ECC1 of 6 bits with regard to the received data body DAT. When the data body DAT is the 32-bit data, the 1-bit error detection and the 1-bit error correction can be made possible through use of the 6-bit error correction code. The first ECC circuit 110C generates a 38-bit target data DAT1 by adding the first error correction code ECC1 to the data body DAT. The first ECC circuit 110C outputs the target data DAT1 (=DAT+ECC1) to the data inversion control circuit 120C.

The data inversion control circuit 120C receives the 38-bit target data DAT1. When the number of the bits of "0" included in the target data DAT1 is equal to or more than 19, the data inversion control circuit 120C determines that the target data DAT1 is to be inverted. In this case, the inversion flag FL is set to "1" to indicate the inversion. On the other hand, when the number of the bits of "0" included in the target data DAT1 is less than 19, the data inversion control circuit 120C determines that the target data DAT1 is not to be inverted. In this case, the inversion flag FL is set to "0" to indicate the non-inversion. The data inversion control circuit 120C generates the storage data DATA of 39 bits by adding the inversion flag FL to the target data DAT1 or the inversion data /DAT1 thereof. Then, the data inversion control circuit 120C outputs the storage data DATA to the switching circuit 60C. The switching circuit 600 outputs the storage data DATA outputted from the data inversion control circuit 120C to the data read/write circuit 30.

When the data is read, the switching circuit 60C outputs the storage data DATA read from the non-volatile semiconductor memory 40 to the data inversion control circuit 120C. The data inversion control circuit 120C refers to the inversion flag FL included in the storage data DATA. When the inversion flag FL indicates the non-inversion, the data inversion control circuit 120C outputs the target data DAT1 included in the storage data DATA to the first ECC circuit 110C, as it is. On the other hand, when the inversion flag FL indicates the inversion, the data inversion control circuit 120C inverts the respective bits of the inversion data /DAT1 included in the storage data DATA again, and recovers the target data DAT1 and then outputs the obtained target data DAT1 to the first ECC circuit 110C.

The first ECC circuit 1100 receives the read target data DAT1 (=DAT+ECC1). The first ECC circuit 110C detects any error with regard to the data body DAT included in the target data DAT1 in accordance with the first error correction code ECC1 included in the target data DAT1. If there is no error, the first ECC circuit 1100 outputs the data body DAT to the switching circuit 500 as it is. If the 1-bit error is detected, the first ECC circuit 210C corrects the error and outputs the corrected data body DAT to the switching circuit 50C. The switching circuit 50C sends the data body DAT outputted from the first ECC circuit 110C to the controller 10.
(Second Mode)

The mode specifying signal MOD for specifying the second mode is supplied to the additional data control circuit 20C. When the mode specifying signal MOD specifies the second mode, the first ECC circuit 110C and the data inversion control circuit 120C may be made inactive.

When the data is written, the switching circuit 50C outputs the data body DAT received from the controller 10 to the second ECC circuit 210C. The second ECC circuit 210C is the 7-bit ECC circuit and calculates a 7-bit second error correction code ECC2 with regard to the received data body DAT. Here, attention should be paid to a fact that the number of bits in the second error correction code ECC2 is greater than the number of bits of the first error correction code ECC1. That is, the data reliability in the second mode is higher than that of the first mode. The second ECC circuit 210C generates the 39-bit storage data DATA by adding the second error correction code ECC2 to the data body DAT. Then, the second ECC circuit 210C outputs the storage data DATA to the switching circuit 60C. The switching circuit 60C outputs the storage data DATA outputted from the second ECC circuit 210C to the data read/write circuit 30.

When the data is read, the switching circuit 60C outputs the storage data DATA read from the non-volatile semiconductor memory 40 to the second ECC circuit 210C. The second ECC circuit 210C detects any error with regard to the data body DAT included in the storage data DATA in accordance with the second error correction code ECC2 included in the storage data DATA. If there is no error, the second ECC circuit 210C outputs the read data body DAT to the switching circuit 50C as it is. If the 1-bit error is detected, the second ECC circuit 210C corrects the error and outputs the corrected data body DAT to the switching circuit 50C. If the 2-bit error is detected, the second ECC circuit 210C sends an error signal ERROR to the controller 10. The switching circuit 50C sends the data body DAT outputted from the second ECC circuit 210C to the controller 10.

3-4. Fourth Example

Figure 7:
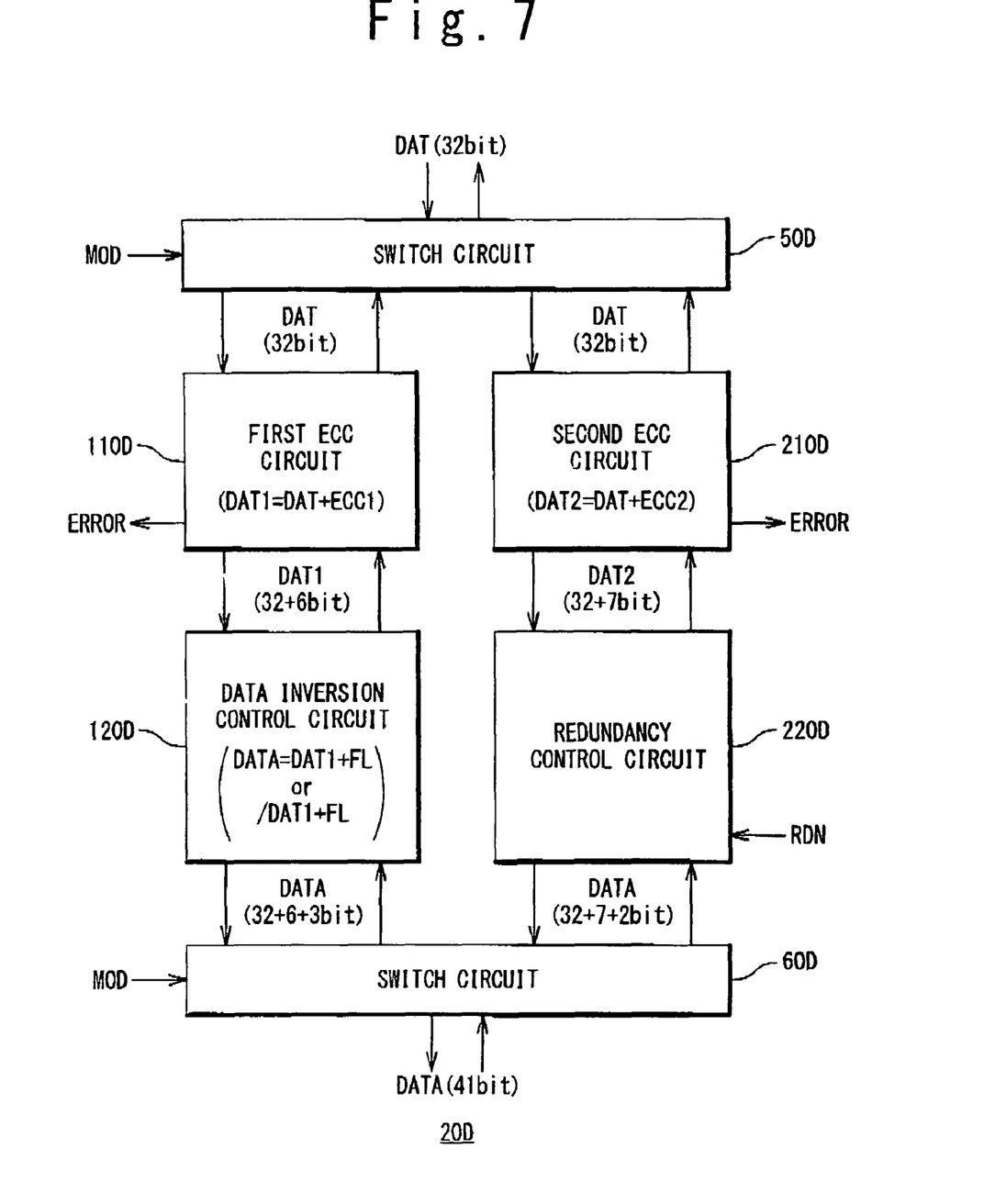
FIG. 7 is a block diagram showing a fourth example of the additional data control circuit.

FIG. 7 shows the fourth example. In this example, an additional data control circuit 20D contains switching circuits 50D and 60D, a first ECC circuit 110D, a data inversion control circuit 120D, a second ECC circuit 2100, and a redundancy control circuit 220D. The switching circuits 50D and 60D carry out the switching in response to the mode specifying signal MOD. The first ECC circuit 110D and the data inversion control circuit 120D are included in the first mode circuit 100. The second ECC circuit 210D is equivalent to the error detection control circuit 210 in FIG. 2B, and this is included in the second mode circuit 200. The redundancy control circuit 220D is also included in the second mode circuit 200. In this example, the additional control data AB has 9 bits (na=9).
(First Mode)

The mode specifying signal MOD for specifying the first mode is supplied to the additional data control circuit 20D. When the mode specifying signal MOD specifies the first mode, the second ECC circuit 210D and the redundancy control circuit 220D may be made inactive.

When the data is written, the switching circuit 50D outputs the data body DAT received from the controller 10 to the first ECC circuit 110D. The first ECC circuit 110D is operated similarly to the first ECC circuit 110C in the third example and generates the target data DAT1 of 38 bits. The data inversion control circuit 120D is operated similarly to the data inversion control circuit 120C in the third example and generates the inversion flag FL. However, in this example, the inversion flag FL has a 3-bit data. The data inversion control circuit 120D generates the storage data DATA of 41 bits by adding the 3-bit inversion flag FL to the target data DAT1 or the inversion data /DAT1 thereof. Then, the data inversion control circuit 120D outputs the storage data DATA to the switching circuit 60D. The switching circuit 60D outputs the storage data DATA outputted from the data inversion control circuit 120D to the data read/write circuit 30.

When the data is read, the switching circuit 60D outputs the storage data DATA read from the non-volatile semiconductor memory 40 to the data inversion control circuit 120D. The data inversion control circuit 120D is operated similarly to the data inversion control circuit 120C in the third example and outputs the target data DAT1 to the first ECC circuit 110D. Here, the data inversion control circuit 120D may correct any error of the read inversion flag FL (3 bits) by using the majority logic. The first ECC circuit 110D is operated similarly to the first ECC circuit 110C in the third example and outputs the data body DAT to the switching circuit 50D. The switching circuit 50D sends the data body DAT outputted from the first ECC circuit 110D to the controller 10.
(Second Mode)

The mode specifying signal MOD for specifying the second mode is supplied to the additional data control circuit 20D. When the mode specifying signal MOD specifies the second mode, the first ECC circuit 110D and the data inversion control circuit 120D may be made inactive.

When the data is written, the switching circuit 50D outputs the data body DAT received from the controller 10 to the second ECC circuit 210D. The second ECC circuit 210D is operated similarly to the second ECC circuit 210C in the third example and calculates a 7-bit second error correction code ECC2. The second ECC circuit 210D generates a 39-bit storage data DAT2 by adding the second error correction code ECC2 to the data body DAT. Then, the second ECC circuit 210D outputs the storage data DAT2 to the redundancy control circuit 220D. The redundancy control circuit 220D converts the storage data DAT2 into the storage data DATA of 41 bits. The switching circuit 60D outputs the storage data DATA outputted from the redundancy control circuit 220D to the data read/write circuit 30.

Figure 8:
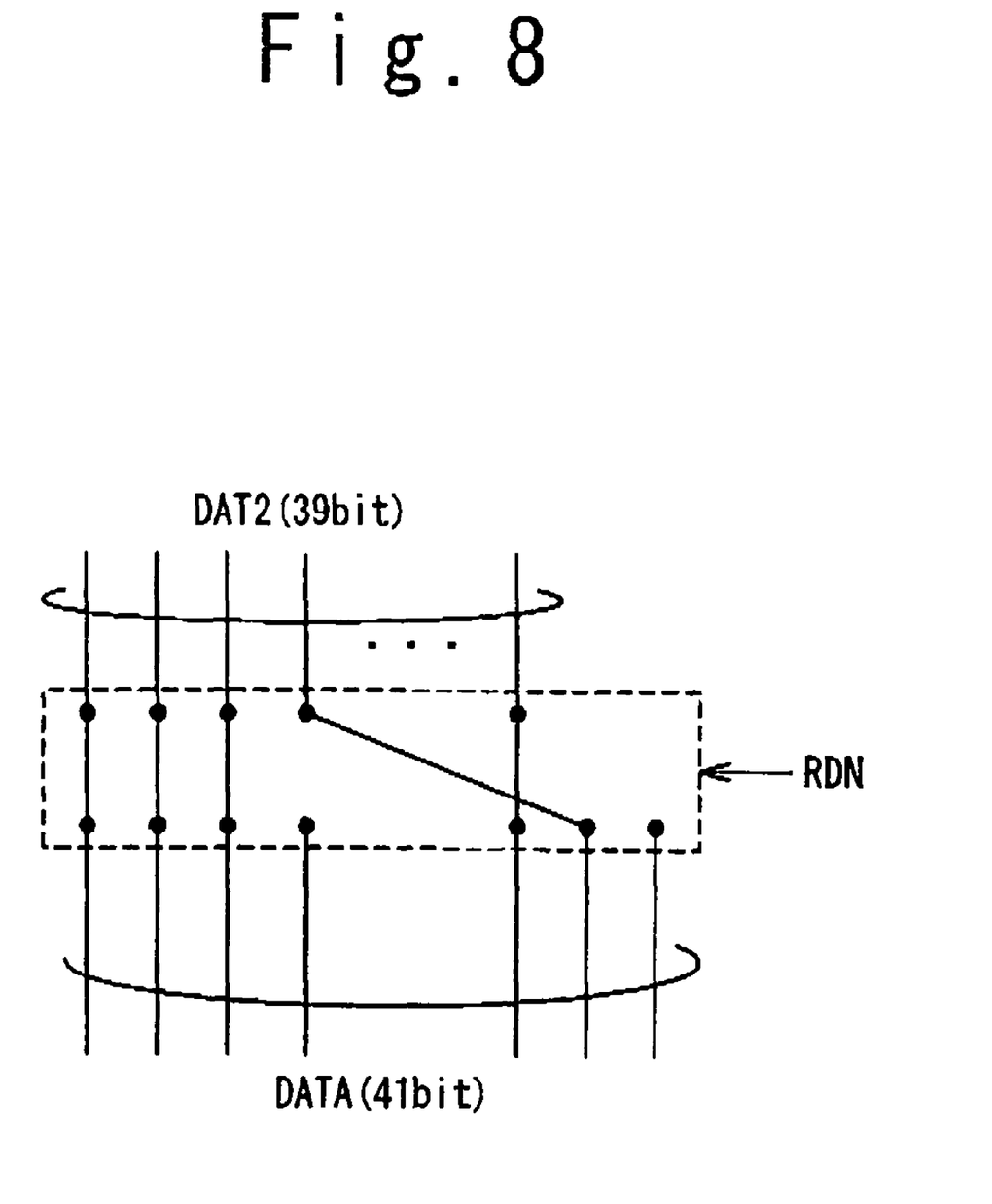
FIG. 8 is a conceptual view showing a redundancy control circuit.

FIG. 8 conceptually shows the redundancy control circuit. In this example, 41 bit lines (data input/output lines) corresponding to the 41-bit storage data DATA are laid on the non-volatile semiconductor memory 40. However, in the second mode, the two bit lines among the 41 bit lines are prepared as redundancy bit lines. That is, the 2-bit redundancy bit is prepared for the 39-bit storage data DAT2. The redundancy control circuit 220D carries out the switching of the data input/output in order to replace a defective bit with the redundancy bit. The switched state is specified by a redundancy control signal RDN. In short, the redundancy control circuit 220D carries out the switching in response to the redundancy control signal RDN and carries out the conversion between the 39-bit storage data DAT2 and the 41-bit storage data DATA.

When the data is read, the switching circuit 60D outputs the storage data DATA read from the non-volatile semiconductor memory 40 to the redundancy control circuit 220D. The redundancy control circuit 220D converts the received storage data DATA into the 39-bit storage data DAT2 and outputs the storage data DAT2 to the second ECC circuit 210D. The second ECC circuit 210D is operated similarly to the second ECC circuit 210C in the third example and outputs the data body DAT to the switching circuit 50D. The switching circuit 50D sends the data body DAT outputted from the second ECC circuit 210D to the controller 10.

3-5. Fifth Example

Figure 9:
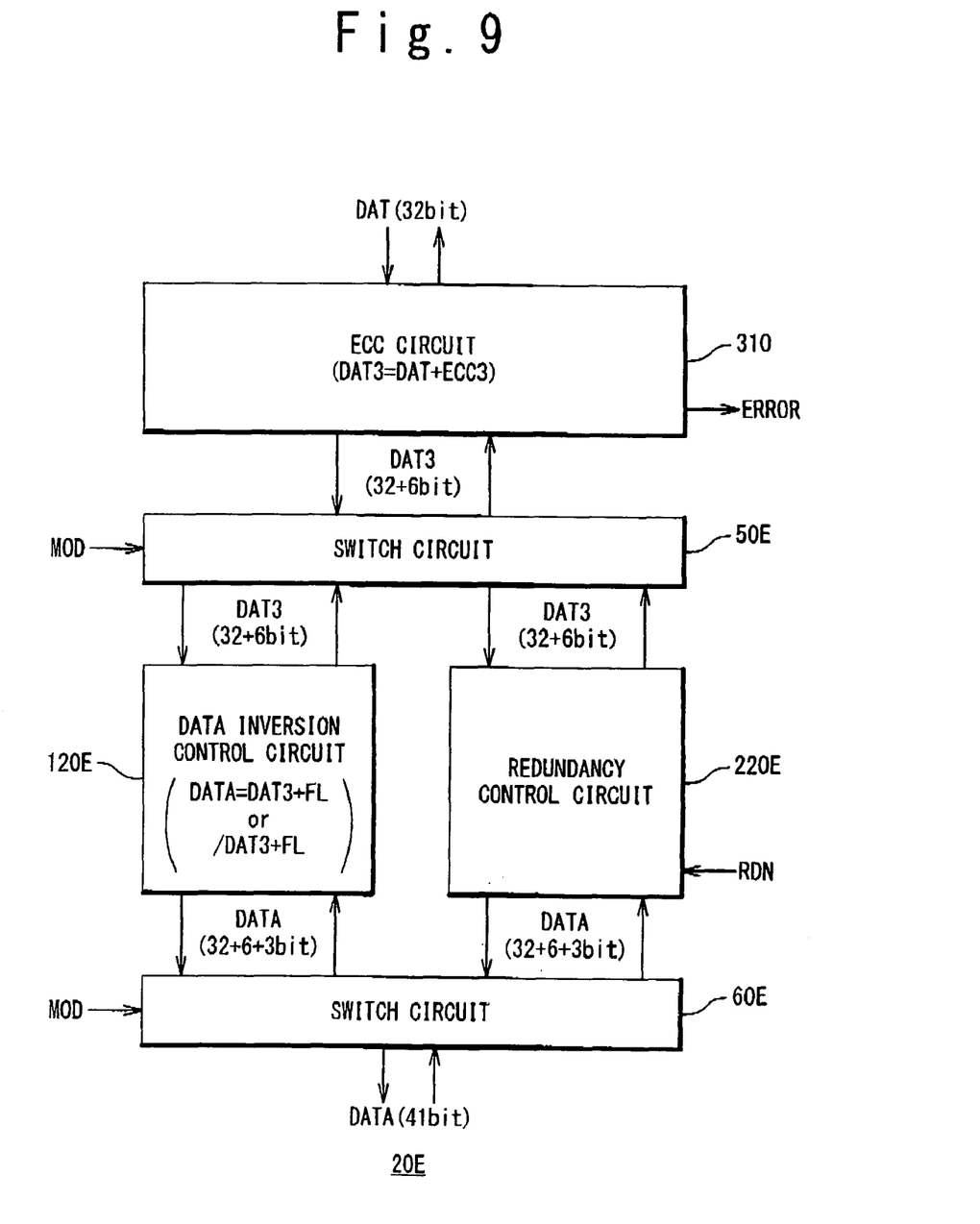
FIG. 9 is a block diagram showing a fifth example of the additional data control circuit.

FIG. 9 shows a fifth example. In this embodiment, an additional data control circuit 20E contains switching circuits 50E and 60E, a data inversion control circuit 120E, a redundancy control circuit 220E, and an ECC circuit 310. The switching circuits 50E and 60E carry out the switching in response to the mode specifying signal MOD. The data inversion control circuit 120E is included in the first mode circuit 100. The ECC circuit 310 is equivalent to the error detection control circuit 210 in FIG. 2B, and this is included in the second mode circuit 200. However, this is also shared by the first mode circuit 100. The redundancy control circuit 220E is included in the second mode circuit 200. In this example, the additional control data AB has 9 bits (na=9).
(First Mode)

The mode specifying signal MOD for specifying the first mode is supplied to the additional data control circuit 20E. When the mode specifying signal MOD specifies the first mode, the redundancy control circuit 220E may be made inactive.

When the data is written, the ECC circuit 310 receives the data body DAT from the controller 10. The ECC circuit 310 is a 6-bit ECC circuit and calculates a 6-bit error correction code ECC3 with regard to the received data body DAT. Moreover, the ECC circuit 310 generates a target data DAT3 of 38 bits by adding the error correction code ECC3 to the data body DAT. Then, the ECC circuit 310 outputs the target data DAT3 (=DAT+ECC3) to the switching circuit 60D.

The switching circuit 50E outputs the target data DAT3 received from the ECC circuit 310 to the data inversion control circuit 120E. The data inversion control circuit 120E is operated similarly to the data inversion control circuit 120E in the fourth example and generates the inversion flag FL of 3 bits. The data inversion control circuit 120E generates the 41-bit storage data DATA by adding the inversion flag FL to the target data DAT3 or the inversion data /DAT3 thereof. Then, the data inversion control circuit 120E outputs the storage data DATA to the switching circuit 60E. The switching circuit 60E outputs the storage data DATA outputted from the data inversion control circuit 120E to the data read/write circuit 30.

When the data is read, the switching circuit 60E outputs the storage data DATA read from the non-volatile semiconductor memory 40 to the data inversion control circuit 120E. The data inversion control circuit 120E is operated similarly to the data inversion control circuit 120D in the fourth example and outputs the target data DAT3 to the switching circuit 50E. The switching circuit 50E outputs the target data DAT3 outputted from the data inversion control circuit 120E to the ECC circuit 310.

The ECC circuit 310 receives the target data DAT3 (=DAT+ECC3). The ECC circuit 310 detects any error with regard to the data body DAT included in the target data DAT3 in accordance with the error correction code ECC3 included in the target data DAT3. If there is no error, the ECC circuit 310 outputs the data body DAT to the controller 10 as it is. If the 1-bit error is detected, the ECC circuit 310 corrects the error and outputs the corrected data body DAT to the controller 10.

(Second Mode)

The mode specifying signal MOD for specifying the second mode is supplied to the additional data control circuit 20E. When the mode specifying signal MOD specifies the second mode, the data inversion control circuit 120E may be made inactive.

When the data is written, the ECC circuit 310 receives the data body DAT from the controller 10. The ECC circuit 310 is a 6-bit ECC circuit and calculates a 6-bit error correction code ECC3 with regard to the received data body DAT. Moreover, the ECC circuit 310 generates a 38-bit storage data DAT3 by adding the error correction code ECC3 to the data body DAT. Then, the ECC circuit 310 outputs the storage data DAT3 (=DAT+ECC3) to the switching circuit 50E.

The switching circuit 50E outputs the storage data DAT3 received from the ECC circuit 310 to the redundancy control circuit 220E. In this example, a 3-bit redundancy bit is prepared for the 38-bit storage data DAT3. The redundancy control circuit 220E is operated similarly to the redundancy control circuit 220D in the fourth example, and converts the storage data DAT3 into the 41-bit storage data DATA. The switching circuit 60E outputs the storage data DATA outputted from the redundancy control circuit 220E to the data read/write circuit 30.

When the data is read, the switching circuit 60E outputs the storage data DATA read from the non-volatile semiconductor memory 40 to the redundancy control circuit 220E. The redundancy control circuit 220E converts the received storage data DATA into the 38-bit storage data DAT3 and outputs the storage data DAT3 to the switching circuit 50E. The switching circuit 50E outputs the storage data DAT3 outputted from the redundancy control circuit 220E to the ECC circuit 310.

The ECC circuit 310 receives the storage data DAT3 (=DAT+ECC3). The ECC circuit 310 detects any error with regard to the data body DAT3 included in the storage data DAT3 in accordance with the error correction code ECC3 included in the storage data DAT3. If there is no error, the ECC circuit 310 outputs the data body DAT to the controller 10 as it is. If the 1-bit error is detected, the ECC circuit 310 corrects the error and outputs the corrected data body DAT to the controller 10.

As mentioned above, the embodiments and examples of the present invention has been described by referring to the attached drawings. However, the present invention may be properly changed by one skilled in the art in a range not departing from a scope of the present invention, without being limited to the above-mentioned embodiments.

What is claimed is:

1. A data processing apparatus comprising:
a non-volatile semiconductor memory in which a storage data including a target data or an inversion data of said target data, as a main storage data and an additional data is stored; and
an additional data control circuit configured to generate said additional data and add said additional data to said main storage data, wherein said additional data is different between a first mode and a second mode, which are set in response to a mode specifying signal,
wherein said additional data control circuit comprises:
a first mode circuit configured to generate said additional data in said first mode; and
a second mode circuit configured to generate said additional data in said second mode,
wherein said first mode circuit comprises:
a data inversion control circuit configured to receive said target data, determine whether each of bits of said target data should be inverted, generate said additional data including an inversion flag indicating the determining result, and generate said storage data by adding said additional data including said inversion flag to said main storage data, and
wherein said second mode circuit comprises:
an error detection control circuit configured to generate said additional data including an error detection code used for error detection to said target data, and generate said storage data by adding said additional data including said error detection code to said main storage data.

2. The data processing apparatus according to claim 1, wherein said non-volatile semiconductor memory comprises a first data region and a second data region,
wherein said mode specifying signal specifies said first mode upon an access to said first data region, and
wherein said mode specifying signal specifies said second mode upon an access to said second data region.

3. The data processing apparatus according to claim 1, wherein when a value of each of bits of said non-volatile semiconductor memory is a first value, a data written state is indicated, and, otherwise, an erased state is indicated,
wherein said target data is an X-bit data,
wherein when the number of bits having said first value in said target data is equal to or more than X/2, said data inversion control circuit determines that each bit of said target data is to be inverted, and when the number of the bits having said first value in said target data is less than X/2, said data inversion control circuit determines that each bit of said target data is not to be inverted.

4. The data processing apparatus according to claim 1, wherein upon data read in said first mode, said data inversion control circuit receives said storage data read from said non-volatile semiconductor memory, and recovers said target data from the read storage data by referring to said inversion flag of said storage data.

5. The data processing apparatus according to claim 4, wherein said inversion flag is a Y-bit data, where Y is an odd number equal to or more than 3, and
upon the data read in said first mode, said data inversion control circuit corrects an error of said inversion flag by using majority logic.

6. The data processing apparatus according to claim 1, wherein upon data read in said second mode, said error detection control circuit receives said storage data read from said non-volatile semiconductor memory, and detects any error of said main storage data of the read storage data based on said error detection code of the read storage data.

7. The data processing apparatus according to claim 6, wherein said error detection control circuit is an ECC circuit,
upon data write in said second mode, said ECC circuit calculates an error correction code to said main storage data of the read storage data as said error detection code, and upon the data read in said second mode, said ECC circuit detects an error based on said error correction code of said read storage data to correct the error.

8. The data processing apparatus according to claim 1, wherein said first mode circuit further comprises a first ECC circuit,
   upon data write in said first mode, said first ECC circuit calculates a first error correction code on said target data and generates said storage data by adding said additional data including said first error correction code to said main storage data.

9. The data processing apparatus according to claim 8, wherein said error detection control circuit is a second ECC circuit,
   upon the data write in said second mode, said second ECC circuit calculates a second error correction code of said main storage data as said error detection code, and
   the number of bits of said second error correction code is more than the number of bits of said first error correction code.

10. A data processing method comprising:
   setting a first mode or a second mode in response to a mode specifying signal;
   receiving a target data upon data write;
   generating an additional data based on said target data, wherein said additional data is different between said first mode and said second mode; and
   adding said additional data to a main storage data to generate a storage data,
   wherein said storage data is stored in a non-volatile semiconductor memory and comprises said main storage data and said additional data, and said main storage data is said target data or an inversion data of said target data,
   wherein said generating and said adding are executed by a data inversion control circuit of a first mode circuit in said first mode,
   wherein said generating comprises:
   determining whether each of bits of said target data should be inverted, in said first mode; and
   generating said additional data including an inversion flag indicating the determining result,
   wherein said adding comprises:
   adding said additional data including said inversion flag to said main storage data in said first mode to generate said storage data,
   wherein said generating and said adding are executed by an error detection control circuit of a second mode circuit in said second mode,
   wherein said generating comprises:
   generating said additional data including an error detection code used for error detection to said target data in said second mode, and
   wherein said adding comprises:
   adding said additional data including said error detection code to said main storage data in said second mode to generate said storage data.

* * * * *